United States Patent [19]

Srivastava et al.

[11] Patent Number: 4,567,447

[45] Date of Patent: Jan. 28, 1986

[54] AUTO TUNING FOR AN OSCILLATOR

[75] Inventors: Gopal K. Srivastava, Buffalo Grove; Ronald B. Lee, Skokie, both of Ill.

[73] Assignee: Zenith Electronics Corporation, Glenview, Ill.

[21] Appl. No.: 500,654

[22] Filed: Jun. 3, 1983

[51] Int. Cl.[4] ............................................. H03L 7/00
[52] U.S. Cl. .................................... 331/1 A; 331/14; 331/20; 358/195.1
[58] Field of Search ......................... 331/1 A, 14, 20; 307/511, 514, 516, 518; 328/133, 134; 358/195.1

[56] References Cited

U.S. PATENT DOCUMENTS

| | | | |
|---|---|---|---|
| 3,939,438 | 2/1976 | Taylor | 331/1 A X |
| 3,988,696 | 10/1976 | Sharpe | 331/1 A |
| 3,989,931 | 11/1976 | Phillips | 331/1 A X |
| 3,991,382 | 11/1976 | Iida et al. | 331/14 |
| 4,105,946 | 8/1978 | Ikeda | 331/14 X |
| 4,138,650 | 2/1979 | Anderson | 331/1 A |
| 4,169,995 | 10/1979 | Wise et al. | 307/511 X |
| 4,271,531 | 6/1981 | Torii et al. | 331/1 A X |
| 4,290,029 | 9/1981 | Streckenbach | 331/1 A |
| 4,380,742 | 4/1983 | Hart | 331/1 A |

FOREIGN PATENT DOCUMENTS 2093289  8/1982  United Kingdom ............... 331/1 A

OTHER PUBLICATIONS

Lee, H. R. "Automatic Voltage-Controlled Oscillator Center Frequency Adjustment" IBM Technical Disclosure Bulletin, v. 26, n. 4 (Sep. 83), pp. 2148-2149.

Primary Examiner—Eugene R. LaRoche
Assistant Examiner—Robert J. Pascal

[57] ABSTRACT

To adjust the free running frequency of a voltage controlled oscillator so that it is close enough to a target frequency for a phase locked loop to lock the frequency, a reference signal is derived from a stable external source. A derived signal is generated from the oscillator. The derived signal and the reference signal are applied to a comparison circuit which examines the relationship of a specific edge of the reference signal at times determined by the signal derived from the oscillator. If the oscillator is within its proper frequency range, the edge of the reference signal will have a certain relationship to the times determined by the derived signal. If this relationship is found to be improper, correction signals are applied to the oscillator. In the preferred embodiment, this occurs in a television receiver where the reference signal is based on a 3.58 megahertz signal. The examination which is made takes an output from a counter which divides by 455, specifically, the 160 count. Times T1 and T2 are developed based on the output of the oscillator. At time T1, the counter output should be low, but at time T2, the counter output should be high. Approximately a 1 microsecond tolerance is provided in both directions. Error is permitted to accumulate during a part of the vertical retrace time. If the error becomes too great, corrective action is taken.

27 Claims, 7 Drawing Figures

AUTO TUNING FOR AN OSCILLATOR

BACKGROUND OF THE INVENTION

The present invention is concerned with adjusting the frequency of an oscillator, and is particularly concerned in its preferred embodiment with adjusting the free running frequency of a voltage controlled oscillator in a television receiver so that it is near enough to a target frequency to permit a phase locked loop to lock in the frequency.

The principal object of the present invention is to provide a circuit which automatically adjusts the free running frequency of a voltage controlled oscillator (VCO) so that it is close enough to the target frequency for the phase locked loop to lock the frequency.

A further object of the present invention is to provide an efficient automatic tuning circuit for a VCO thereby to permit a narrowing of the bandwidth otherwise required in the phase locked loop which correspondingly becomes more immune to noise.

Still another object of the present invention is to provide a circuit which eliminates the requirement for factory tuning as well as the effects of aging and temperature drifts in the VCO circuit.

BRIEF DESCRIPTION OF THE DRAWING

In describing a preferred embodiment of the present invention, reference is made to the accompanying drawings wherein.

DESCRIPTION OF A PREFERRED EMBODIMENT

Figure 1:
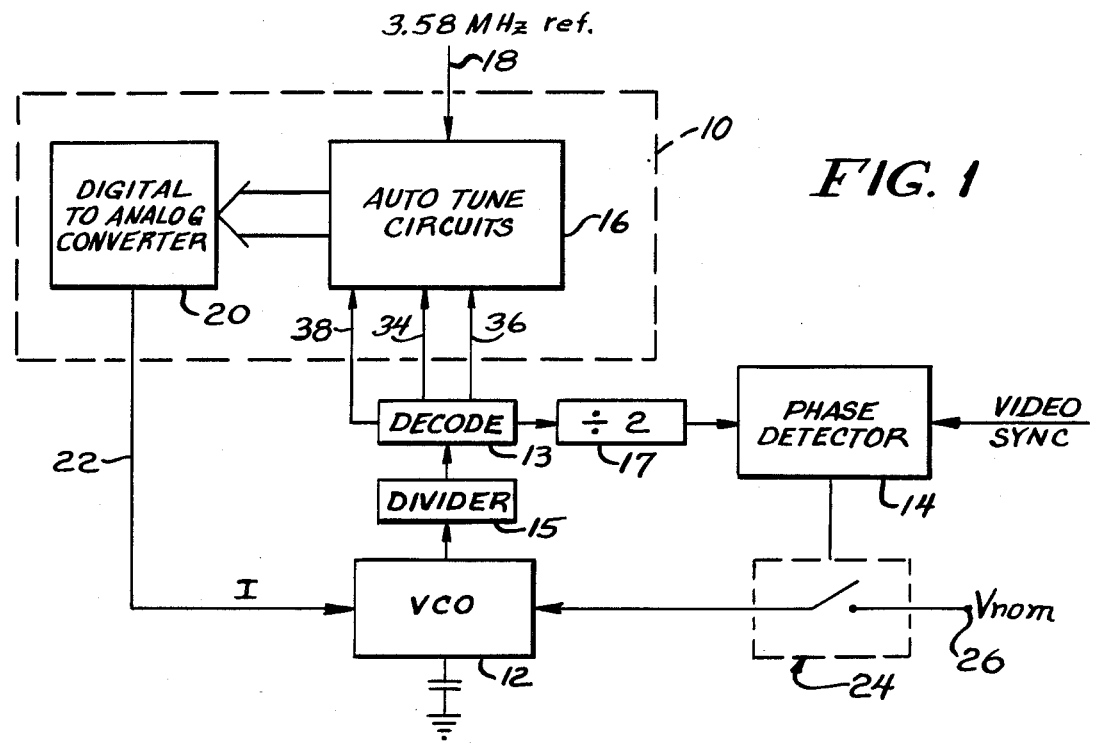
FIG. 1 is a block diagram illustrating how the circuit of the present invention may be associated with the voltage controlled oscillator of a phase locked loop in a television receiver or elsewhere.

Referring to FIG. 1, an automatic tuning circuit 10 (within the box formed by the dashed line) is shown in combination with a voltage controlled oscillator (VCO) 12 and a phase detector 14. As illustrated, VCO 12 has an output nominally at a frequency $16f_H$ (where $f_H$ is the horizontal scanning frequency of the television receiver). This output is coupled to a divider 15 which divides the VCO's output by eight. Various outputs of this divider are connected to a decoder 13 which provides various outputs at a frequency $2f_H$. One of the $2f_H$ outputs is coupled to a divider 17 which divides this by two and then couples it to phase detector 14. Two $2f_H$ outputs, 34 and 36, are connected to a portion 16 of the automatic tuning circuit 10. Circuit portion 16 also receives an input 18 which is a 3.58 megahertz signal from the crystal oscillator in the television receiver (used generally for the color demodulation). The output of circuit portion 16 is applied to a digital to analog converter 20 which provides a current I on an output 22 applied to VCO 12. It is to be understood that other signals are generated in or applied to the circuit portion 16, and these will be described in connection with FIGS. 2 and 3.

The operation of FIG. 1 basically is that during a portion of the vertical interval, the voltage input to VCO 12 is a nominal voltage provided by a DC reference source 26 via switch 24. The reference voltage $V_{nom}$ is that voltage which is expected to cause VCO 12 to free run at a frequency of $16f_H$. Next, the outputs of the decoder 13 are compared in circuit portion 16 to a frequency derived from the 3.58 megahertz reference to generate an error signal, which is converted to an analog current I. This current is applied to VCO 12 and is used as a fine adjustment in VCO 12 until the next correction occurs, which in the present embodiment cannot be prior to the next vertical interval, but which may be several vertical intervals thereafter, depending upon the stability of the system.

Figure 2:
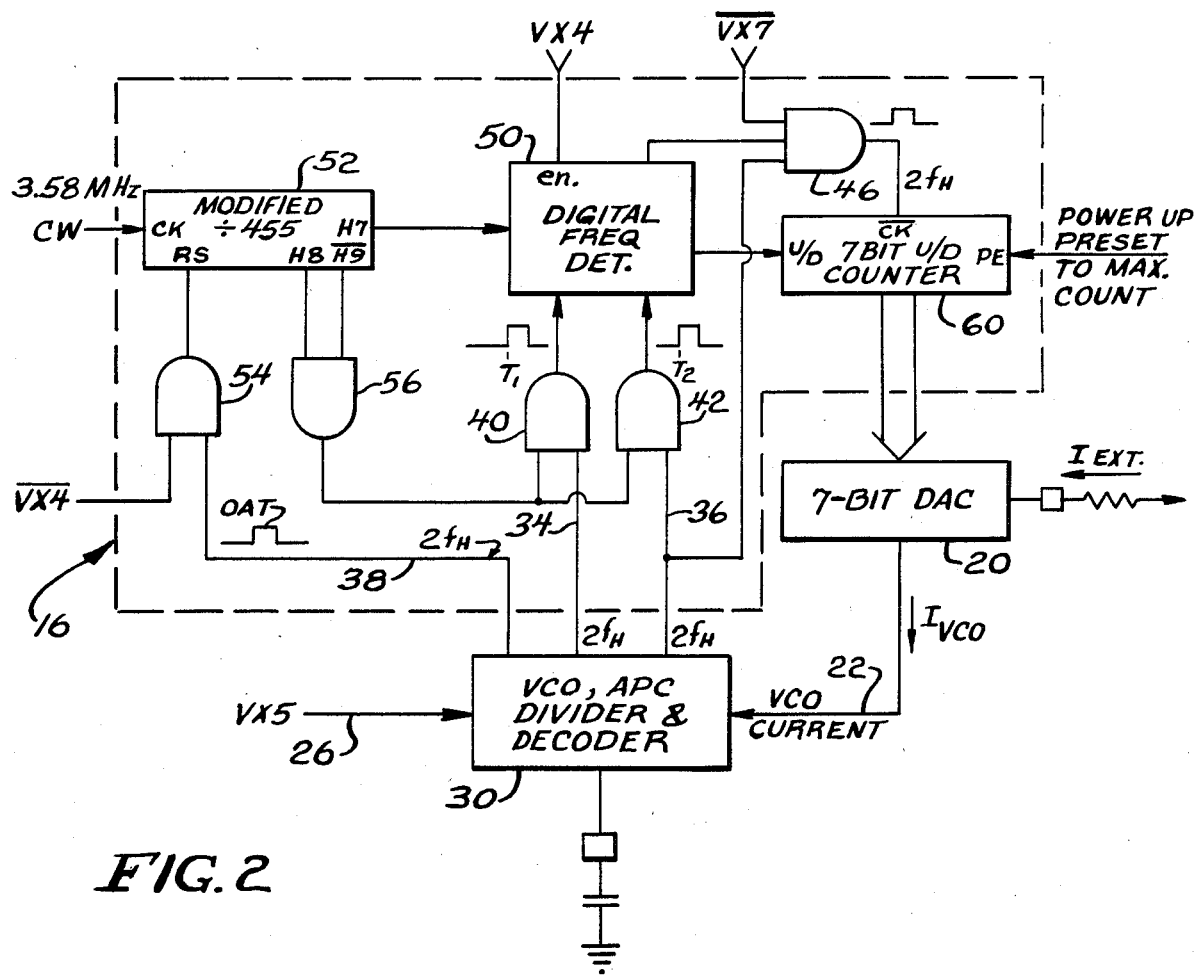
FIG. 2 illustrates a representative embodiment of a circuit, partially in block form and partially in schematic form, according to various aspects of the present invention.

Referring to FIG. 2, Circuit 30 contains dividers 15 and 17, decoder 13, VCO 12 and phase detector 14. Various circuits are shown within the dashed line representing auto tune portion 16. As can be seen, circuit 30 provides two separate outputs 34 and 36 at the $2f_H$ frequency to a group of AND gates 40, 42, and 46. The outputs of AND gates 40 and 42 are signals at a frequency of $0.5f_H$, which are applied to a digital frequency detector 50.

Figure 6:
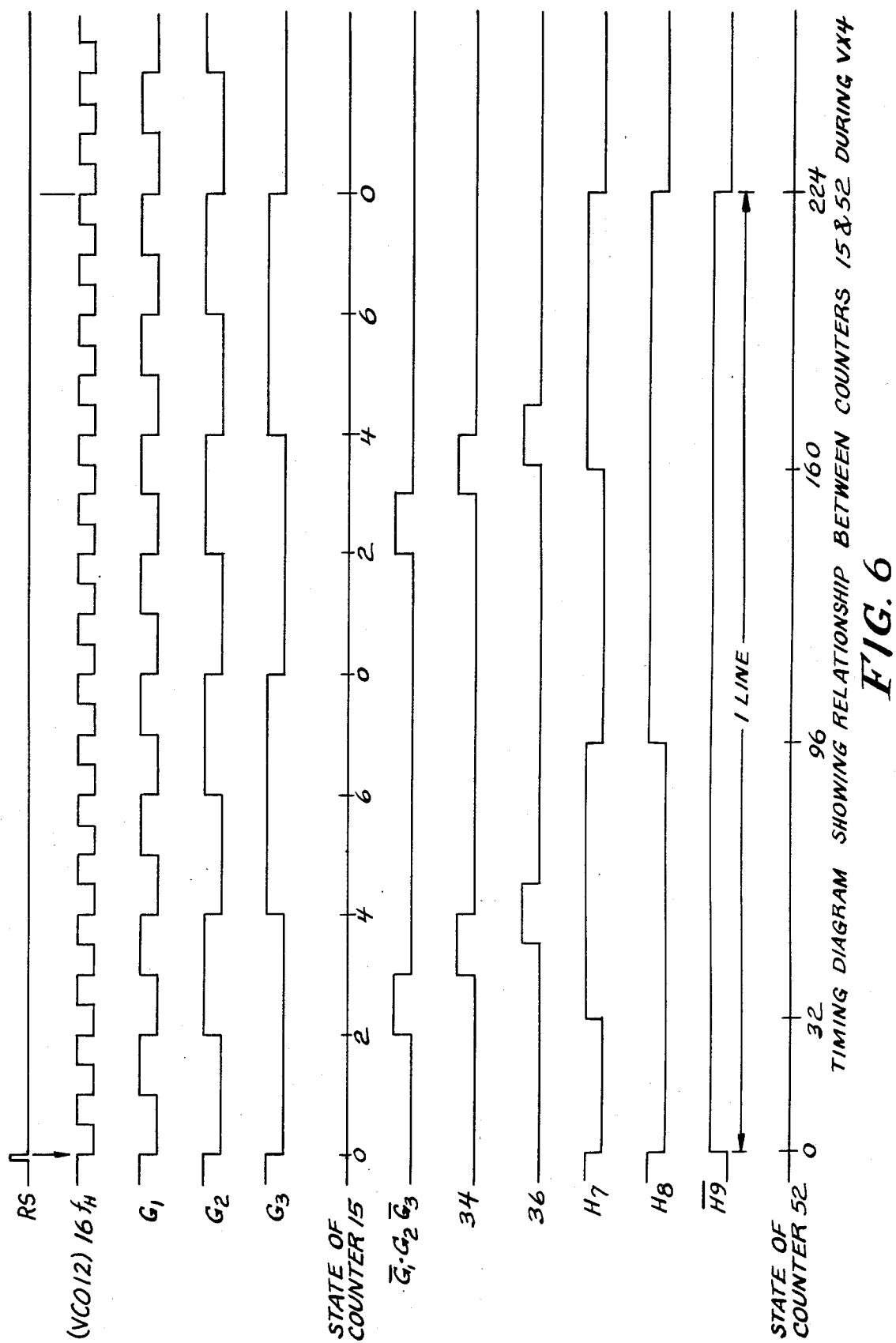
FIG. 6 is a timing diagram showing timing relationship between counters 15 and 52 of FIGS. 1 and 2.

Another input to digital frequency detector 50 is provided by a counter 52 which provides a signal repetitive at $0.5f_H$ based on a stable source. In the illustrative embodiment, this is provided by counter 52 which is clocked by the 3.58 megahertz signal and set to divide by 455. The reset input RS of counter 52 is coupled to an AND gate 54 which receives signal 38 from decoder 13 and a signal $\overline{VX4}$ (FIG. 3) related to the vertical interval of the television receiver. Counter 52 has various output stages including an output H7 (FIGS. 3 and 6) which is repetitive at $0.5f_H$ and is coupled to one input of digital frequency detector 50. Other outputs of counter 52 are H8 (FIGS. 3 and 6) and H9 (FIGS. 3 and 6), both of which are applied to an AND gate 56 whose output is coupled to AND gates 40 and 42.

Before turning to a description of how these circuits operate, another signal VX5 is shown in FIG. 2 (bottom left) and should be mentioned. Signal VX5 (FIG. 3) is applied to the circuits 30 and has a duration of seven horizontal lines during the vertical interval. Signal VX5 determines when the nominal voltage $V_{nom}$ is applied to the input of VCO 12. A signal VX5 can be obtained routinely by those ordinarily skilled in the art. As explained with reference to FIG. 1, the nominal voltage $V_{nom}$ causes VCO 12 to free run at a frequency close to $16f_H$.

It will be appreciated that when VX5 causes the input of VCO 12 to be switched to $V_{nom}$, a settling time is required before stable operation of VCO 12 can be expected. Accordingly, two horizontal lines of time are allowed for VCO 12 to settle. During the last five lines of time of VX5, the frequency comparison is achieved by auto tune circuit portion 16. This particular time is determined by a signal VX4 (FIG. 3), and it will be seen that the signal VX4 is applied to the ENABLE input of digital frequency detector 50.

By way of an overview of the operation of the circuit of FIG. 2, the free running frequency of VCO 12 (in circuit 30) is ideally at $16f_H$ as mentioned above. A signal derived from the output of the VCO can be compared to a reference frequency developed from the highly stable 3.58 megahertz frequency from the crystal oscillator. Comparison of the output signal derived from VCO 12 to such a reference signal will show whether VCO 12 is sufficiently near $16f_H$ for its intended purposes.

Figure 3:
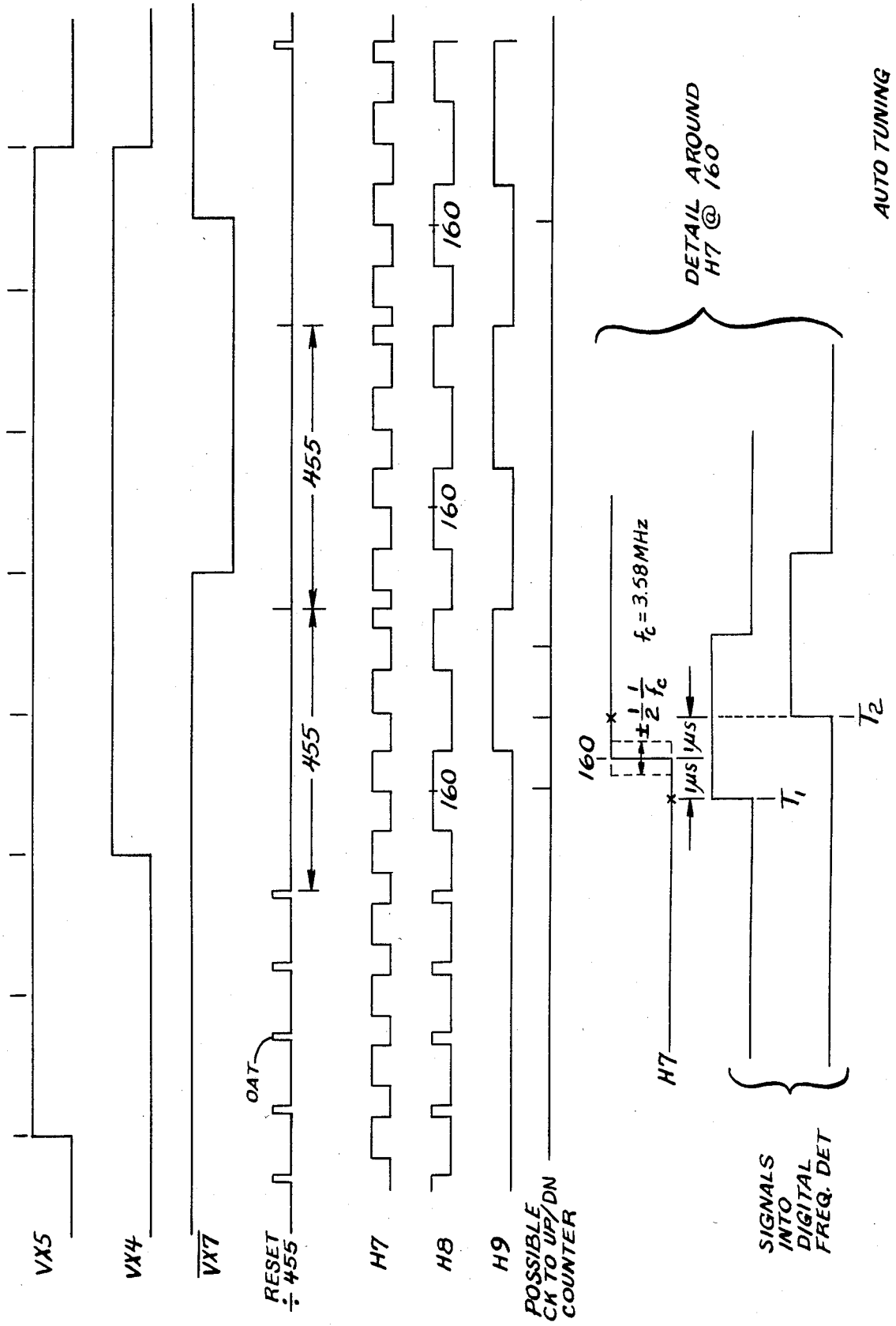
FIG. 3 is a set of waveforms which occur in the circuit of FIG. 2.

In the operation of this illustrative embodiment, the H7 output of counter 52 serves as the reference. A reset pulse OAT derived from VCO 12 initially phases counter 52 with VCO 12 such that the edge of output H7 at count 160 should have a specific relationship to times T1 and T2 defined by edges at the output of AND gates 40 and 42 which are derived from VCO 12. The timing of T1 and T2 is such that the edge of H7 at count 160 should fall between times T1 and T2 (see FIG. 3). In fact, approximately a one microsecond interval between T1 and the edge of H7 at count 160 is expected, and a one microsecond interval between the edge of H7 at count 160 and the signal T2 is expected. FIG. 3 shows this relationship in a detailed timing chart at the time when H7 occurs at a count of 160.

After resetting counter 52 by means of reset pulse OAT, any error in frequency of the VCO relative to the 3.58 megahertz will cause the H7 signal to slip with respect to T1 and T2. This slippage is allowed to accumulate during the five lines defined by VX4 by disabling the resetting of counter 52 by the OAT pulse for the five lines defined by VX4. If the frequency difference is outside a given range, the edge of H7 at count 160 will fail to fall between times T1 and T2 as expected. This condition is detected by testing H7 at times T1 and T2 during the five lines defined by VX4. If VCO 12 is operating within the proper frequency range, then at time T1, the signal H7 will be low, and at time T2, the signal H7 will be high, as shown in FIG. 3. If the test results in a sequence of anything other than low, high (corresponding to the state of H7 at times T1 and T2 respectively), then it can be concluded that the frequency of VCO 12 has drifted outside the proper frequency range, and an adjustment is necessary.

If no slippage is detected, then no modification is required because VCO 12 is in the range where it belongs. An up-down counter 60 is coupled to digital frequency detector 50, and its state is changed in response to detections of error in the frequency of VCO 12. The output of the up-down counter is applied via a digital to analog converter 20 to adjust the free running frequency of VCO 12. The counter is arranged to receive signals which achieve convergence of the VCO output frequency on the target frequency.

With this overview, the further description of the circuit of FIG. 2 and its operation will be more readily understood.

Counter 52 is a nine bit counter set to divide by 455. It will be appreciated that the input signal of 3.58 megahertz divided by 455 amounts to one-half the horizontal frequency $f_H$. Counter 52 is modified in the customary and known fashion to cause the seventh bit H7 to come out early. This is illustrated in the H7 waveform of FIG. 3.

As can be seen, the outputs 34 and 36 from decoder 13 associated with the VCO are at a frequency of $2f_H$. These pulses are considerably more frequent than needed, because signals defining T1 and T2 are needed only around those edges of the H7 pulse which corresponds to the 160 count. Accordingly, outputs H8 and H9 are ANDed in logic gate 56 to enable logic gates 40 and 42. The output of gate 40 will have a pulse with an edge at time T1. The output of logic gate 42 will be a pulse having an edge at time T2. It will be understood that superfluous pulses are thereby blocked by logic circuits 40, 42 and 56.

It will be seen that the signal H9 (FIG. 3) is a square wave of approximately 50% duty cycle beginning after VX4 changes state. This is because until the signal VX4 goes on, counter 52 is reset by signals OAT from decoder 13, and counter 52 never reaches a large enough count to change the state of the H9 output. However, once the VX4 signal changes state, counter 52 will not be reset by the OAT signal.

During the five line interval defined by the signal VX4, digital frequency detector 50 makes the test comparing the reference edge (low to high transitions on H7 at count 160) to the derived signals from VCO 12 a total of three times. If the reference edge does not fall between times T1 and T2 during the first test of the three, then this signifies a larger error, which merits a larger increment of the up-down counter 60. In the preferred embodiment, the up-down counter will be incremented four counts if slippage is detected on the first test. If slippage is not detected until the second test, then up-down counter 60 is incremented only one count. Similarly, if a slippage is not detected until the third test, there will be an incrementing of one count of up-down counter 60.

It will be understood that the outputs H1 through H7 of counter 52 each have an edge at the 160 count which may be used for the reference signal. However, since H7 is the lowest frequency output with an edge at the 160 count, this is the preferred reference signal. This is because the neighboring edges of the 160 edge of H7 are sufficiently far away in time that the accumulated slippage over five lines would not be expected to cause one of these neighboring edges to fall between T1 and T2 and thereby confuse the frequency detector. This allows for simplified frequency detector design.

Figure 4:
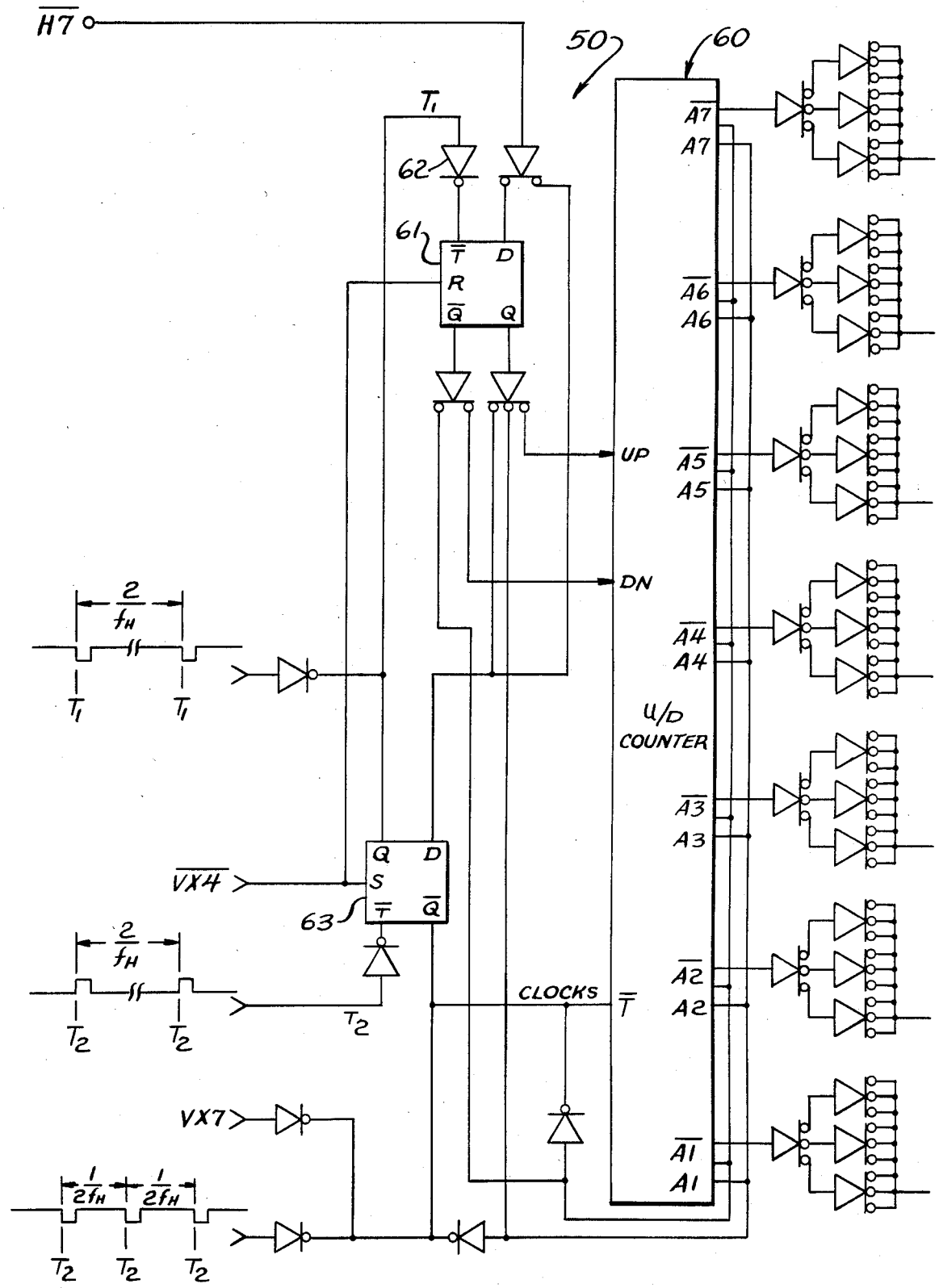
FIG. 4 is a schematic diagram illustrating various elements of the circuit of FIG. 2 in integrated injection logic ($I^2L$).

FIG. 4 shows a schematic diagram of detector 50 in I²L logic. As can be seen, this illustrative embodiment uses negative edge triggered D type flip-flops. Flip-flop 61 samples H7 at time T1. The pulse applied to an inverter 62 coupled to the T input of flip-flop 61 has a positive edge at time T1. Signal H7 is applied to the D input of flip-flop 61. It "sees" H7 as being either high or low. If H7 is found to be low, detector circuit 50 cannot determine whether VCO 12 is within range because low is expected. An error cannot, in this case, be determined until time T2. However, if at time T1, the H7 signal is high, detector 50 can logically conclude that VCO 12 is not at the proper frequency (because as discussed supra, at time T1, the H7 signal should be low).

At time T2, detector 50 determines two things: (1) is H7 high? (2) was H7 high at time T1? If H7 is high at time T2, and at time T1 H7 was low, then detector 50 determines logically that VCO 12 is within the proper range. Accordingly, a flip-flop 63 does not change state, and up-down counter 60 is not allowed to be clocked.

On the other hand, if signal H7 is low at time T2, or if H7 was high at time T1, then flip-flop 63 changes state. When this happens, it enables clock signals to be applied to up-down counter 60. Once flip-flop 63 changes state, detector 50 remains in this condition until it is reinitialized by the $\overline{VX4}$ signal which is applied to the reset input of flip-flop 61 and the set input of flip-flop 63. Flip-flop 61 is disabled by the Q output of flip-flop 63, coupled by inverter 62 to the toggle input $\overline{T}$ of flip-flop 61.

Referring again to FIG. 2, it will be seen that the clock input of up-down counter 60 is coupled to receive various signals via AND gate 46. Specifically, signals at the $2f_H$ rate on line 36 from the decoder 13, a portion of 30, are coupled to the input of AND gate 46. Similarly, an output from digital frequency detector 50 is applied to gate 46. This is the $\overline{Q}$ output of flip-flop 63 (FIG. 4). Finally, a signal $\overline{VX7}$ is applied to another input of gate 46. The signal $\overline{VX7}$, illustrated in FIG. 3, is a signal which has a duration of two and one-half horizontal lines.

This arrangement of inputs to AND gate 46 operates to permit only four pulses to reach the clock input of counter 60. These pulses are illustrated in FIG. 3. If error is detected in the first of the three tests, then three pulses will be permitted to clock counter 60 before the signal $\overline{VX7}$ drops low, and later, when $\overline{VX7}$ goes high again, as illustrated in FIG. 3, a fourth pulse will clock counter 60. If the first test shows no error, then logic gate 46 will not yet be enabled by the input thereto from frequency detector 50, so the first three possible pulses will be blocked by gate 46. If error is detected during either the second or third test, then the inputs to gate 46 will permit only the fourth possible pulse to clock up-down counter 60.

Figure 5:
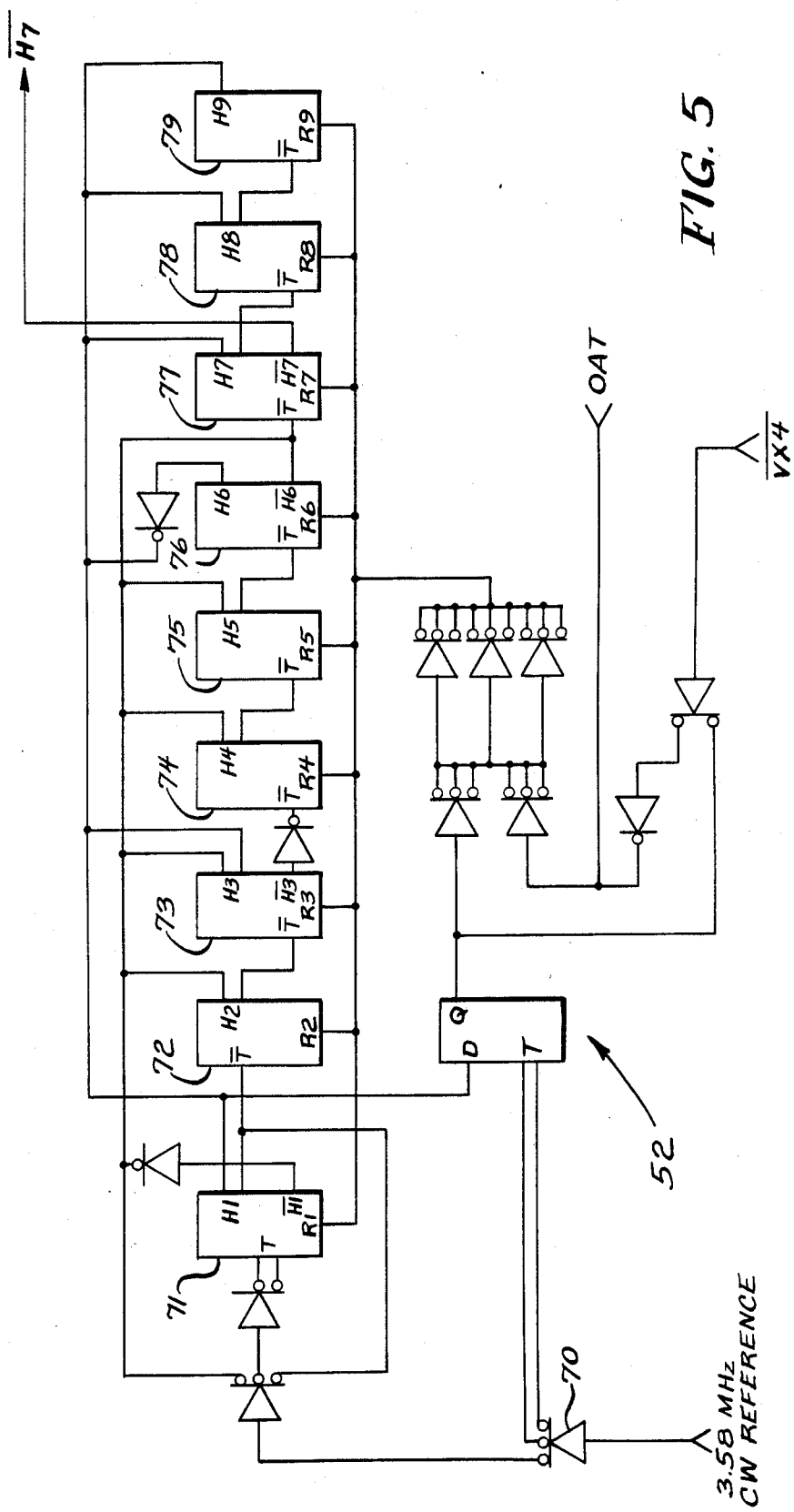
FIG. 5 is a circuit representation of block 52 shown in FIG. 2.

In the interests of full and complete disclosure, FIG. 5 is a schematic diagram in I²L logic of the modified counter 52. The 3.58 megahertz input signal is applied to the input of gate 70 and is then divided by flip-flops 71 and 72, connected as a synchronous counter. Flip-flops 73 through 76 are connected as a 4-bit ripple counter. The outputs of flip-flops 71 through 76 are decoded and ANDed with the 3.58 megahertz input to clock flip-flops 77 through 79 which are connected as a 3 bit ripple counter. This combination of ripple counters minimizes the delay of the H7 output relative to the clock while allowing the use of simpler ripple counters rather than more complex synchronous counters. This combination also allows the modification of the count from straight binary in order to get an edge at the 160 count at H7. This is accomplished by proper decoding of the outputs of flip-flops 71 through 76 which is ANDed with the 3.58 megahertz input and fed to the clock of flip-flop 77.

Figure 7:
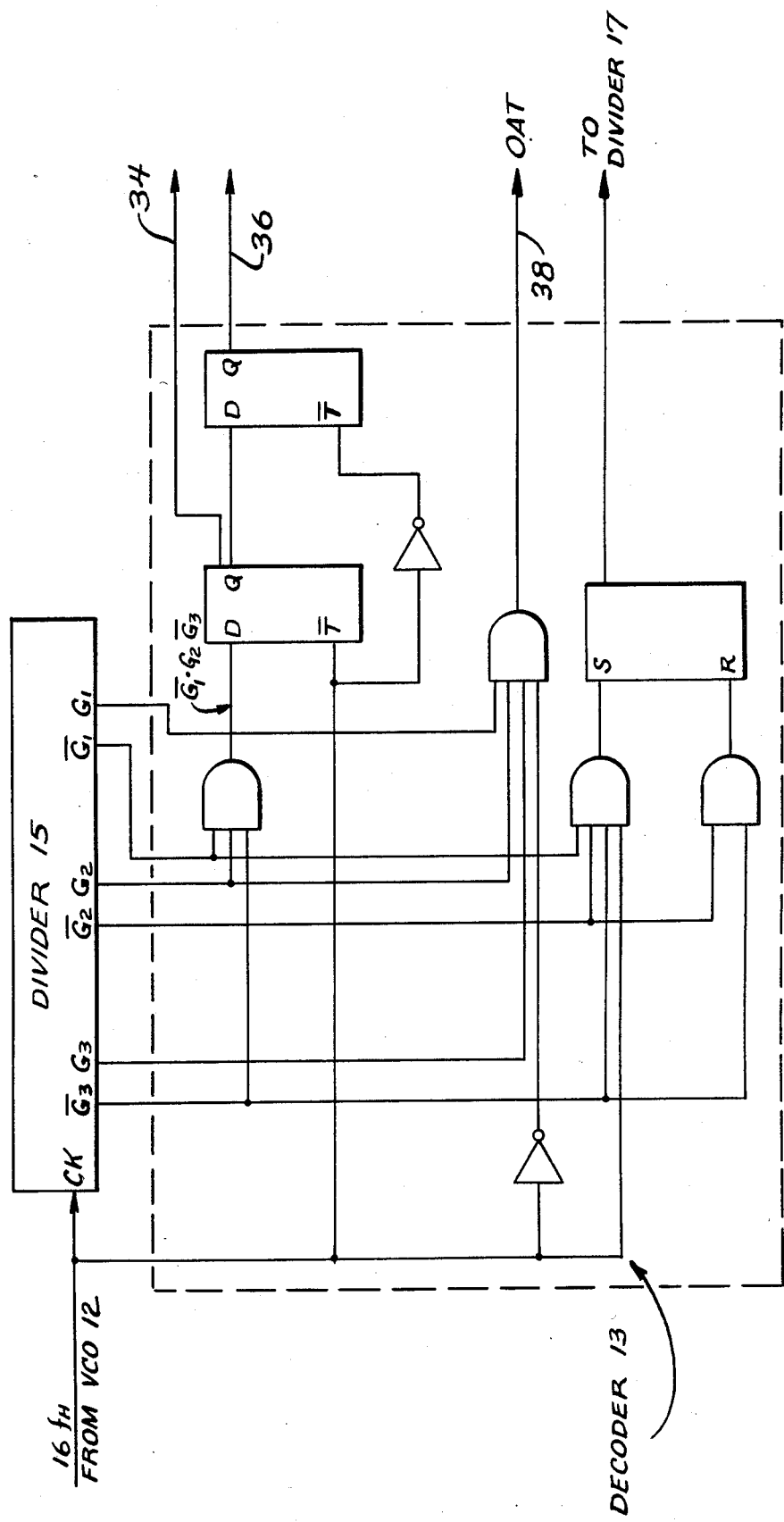
FIG. 7 is a detailed system diagram for dividers 15 and decoder 13 of FIG. 1.

FIG. 7 illustrates the preferred embodiment of the decoder 13, divider 15 of block 30, which also contains the VCO 12 and phase detector 14.

In operation, it has been found that the embodiment described herein can correct the frequency of VCO 12 by about plus or minus 15%. The present invention tunes the oscillator and gives it crystal stability in the long term. It eliminates the necessity for factory tuning of that oscillator and compensates for the effects of aging and temperature drifts, and other factors which can change the free running frequency of the oscillator. As a result of the present invention, the phase locked loop associated with the oscillator now can have a narrower band width, and thereby will be more immune to noise. Accordingly, it will be appreciated that substantial advantages result from the present arrangement of elements and circuits.

While the present invention has been described herein in terms of an illustrative embodiment, it is intended that the scope of protection afforded to the present invention is to be determined by the appended claims.

What is claimed is:

1. An automatic tuning circuit for adjusting the free-running frequency of a controllable oscillator in a receiver comprising:
   reference means for generating a stable reference signal;
   means for free-running said controllable oscillator;
   means coupled to said controllable oscillator for providing, based on the output of said oscillator, a derived signal comprising two timing signals representing the output of said oscillator at different phases and including test logic circuits for gating said two timing circuits to provide test times T1 and T2;
   a detector circuit coupled to receive said reference signal and responsive to said test times T1 and T2 for determining if said oscillator is operating in a given frequency range by detecting the presence of a desired relationship between the test times and the reference signal and providing an error signal indicative of said presence; and
   adjustment means responsive to said error signal and controllingly coupled to the oscillator for adjusting its frequency based on said error signal.

2. The tuning circuit according to claim 1, wherein said detector circuit is operable during only said test times.

3. The tuning circuit according to claim 1 further including synchronizing means for synchronizing said reference means to the controllable oscillator.

4. The tuning circuit according to claim 3 further including disablement means coupled to said reference means for disabling said synchronization during selected times.

5. The tuning circuit according to claim 1 wherein said adjustment means includes an up-down counter coupled to said detector circuit and a digital to analog converter coupling said up-down counter to said controllable oscillator.

6. The tuning circuit according to claim 5 wherein said up-down counter includes a clock coupled to said detector circuit.

7. The tuning circuit according to claim 6 further including a clock logic circuit coupling said detector circuit to said clock of said up-down counter, said clock logic circuit being operable to regulate the number of clock pulses applied to said counter.

8. The tuning circuit according to claim 4 wherein the controllable oscillator is a voltage controlled oscillator in a television receiver and wherein said disablement means is responsive to the operation of said television receiver so that said selected times occur for a duration corresponding to a predetermined number of horizontal scan lines.

9. The tuning circuit according to claim 8 wherein said reference means produces said stable reference signal from a 3.58 megahertz signal.

10. The tuning circuit according to claim 8 wherein said reference means includes a divider circuit clocked by a 3.58 megahertz signal.

11. The tuning circuit according to claim 10 including timing logic circuits coupled to said divider circuit, said derived signal means and to said detector circuit, said timing logic circuits being arranged to determine occasions when the presence of said desired relationship may be detected.

12. The tuning circuit according to claim 1 wherein said detector circuit detects the state of said reference signal at times T1 and T2.

13. The tuning circuit according to claim 12 wherein said reference means includes a divider circuit coupled to a 3.58 megahertz signal, said divider circuit including a 9 stage counter which divides said 3.58 megahertz signal by 455; and further including a gating logic circuit coupled to the 8th and 9th stages of said counter; said means for providing said derived signal being operable to provide said two timing signals nominally at a frequency which is double the frequency of horizontal scan in a television receiver but being out of phase with respect to each other, said two timing signals being gated by the output of said gating logic circuit to define times T1 and T2.

14. The tuning circuit according to claim 13 wherein said reference signal is based on the 7th stage output of said 9 bit counter.

15. The tuning circuit according to claim 12 wherein said tuning circuit is operable to generate times T1 and T2 on plural occasions during the vertical interval of said television receiver.

16. The tuning circuit according to claim 15 wherein said adjustment means includes an up-down counter having a clock input coupled to said detector circuit by a clock logic circuit operable to regulate the number of clock pulses applied to said clock input of said up-down counters; and wherein said clock logic circuit is arranged to change the count of said up-down counter by a greater amount during the first of said plural occasions than the amount during another of said plural occasions when T1 and T2 occur and the presence of said desired relationship is not detected by said detector circuit.

17. A method for automatically tuning the frequency of a controllable oscillator in a receiver comprising the steps of:
generating a stable reference signal;
free-running said controllable oscillator;
deriving a signal from the output of the controllable oscillator comprising two timing signals representing the output of said oscillator at different phases;
determining whether said oscillator is operating in a given frequency range by examining the state of said reference signal at first and second test times $T_1$ and $T_2$ based on said two timing signals and providing an error signal indicative thereof;
controlling the oscillator in accordance with the error signal.

18. The method according to claim 17 including the further step of synchronizing the reference signal to the operation of the controllable oscillator.

19. The method according to claim 18 further including disabling said synchronizing step during selected times.

20. The method according to claim 17 wherein said controlling step includes operating a multiple state device in accordance with said error signal.

21. The method according to claim 20 wherein said controlling step includes generating clock signals applied to said multiple state device and regulating the number of clock pulses in accordance with said error signal.

22. The method according to claim 17 wherein said controllable oscillator is located in a television receiver, wherein said generating a stable reference signal includes producing a 3.58 megahertz signal and generating a lower frequency signal therefrom.

23. The method according to claim 22 wherein said times T1 and T2 are generated on plural occasions during the vertical interval of the television receiver and wherein respective determinations are made in accordance with said test times.

24. The method according to claim 23 wherein said controlling step includes changing the state of a multiple state device a greater amount during a first of said plural occasions and changing the state of said multiple states device a lesser amount during another of said plural occasions if the presence of said desired relationship is detected when times T1 and T2 occur.

25. A method for automatically tuning the frequency of a controllable oscillator in a television receiver comprising the steps of:
generating a first reference signal based on a 3.58 megahertz signal within the receiver;
free-running said controllable oscillator:
deriving first and second timing signals from said oscillator;
generating a second reference signal also based on said 3.58 megahertz signal, which is related to said first reference signal;
deriving first and second test times based on said timing signals and said second reference signal;
determining if said oscillator is operating in a given frequency range by examining the state of said first reference signal at said first and second test times, and generating an error signal indicative of the examinations;
adjusting said oscillator frequency in accordance with the error signal.

26. The method of claim 25 wherein said first and second test times are generated on plural occasions during the vertical interval of the television receiver, and wherein respective determinations are made in accordance with said test times.

27. The method according to claim 26 wherein said adjusting step includes changing the state of a multiple state device a greater amount during a first of said plural occasions, and changing the state of said multiple state device a lesser amount during another of said plural occasions if said reference signal is not found to be in a predetermined relationship with respect to said test times.

* * * * *